US010944033B2

(12) United States Patent
Haiberger et al.

(10) Patent No.: US 10,944,033 B2
(45) Date of Patent: Mar. 9, 2021

(54) HEAT TRANSMISSIVE OPTOELECTRONIC COMPONENT AND MODULE

(71) Applicant: OSRAM Opto Semiconductors GmbH, Regensburg (DE)

(72) Inventors: Luca Haiberger, Regensburg (DE); David Racz, Regensburg (DE); Matthias Sperl, Mintraching (DE)

(73) Assignee: OSRAM OLED GmbH, Regensburg (DE)

( * ) Notice: Subject to any disclaimer, the term of this patent is extended or adjusted under 35 U.S.C. 154(b) by 4 days.

(21) Appl. No.: 16/066,552

(22) PCT Filed: Jan. 10, 2017

(86) PCT No.: PCT/EP2017/050407
§ 371 (c)(1),
(2) Date: Jun. 27, 2018

(87) PCT Pub. No.: WO2017/121725
PCT Pub. Date: Jul. 20, 2017

(65) Prior Publication Data
US 2019/0013451 A1      Jan. 10, 2019

(30) Foreign Application Priority Data
Jan. 11, 2016   (DE) .................. 10 2016 100 320.4

(51) Int. Cl.
*H01L 33/00*   (2010.01)
*H01L 33/62*   (2010.01)
(Continued)

(52) U.S. Cl.
CPC ............ *H01L 33/62* (2013.01); *H01L 31/024* (2013.01); *H01L 31/02005* (2013.01);
(Continued)

(58) Field of Classification Search
CPC ....... H01L 31/02005; H01L 31/022408; H01L 31/024; H01L 33/641; H01L 33/642
(Continued)

(56) References Cited

U.S. PATENT DOCUMENTS

| 4,672,736 A | 6/1987 | Westermeier |
| 2007/0099317 A1 | 5/2007 | Ryu et al. |

(Continued)

FOREIGN PATENT DOCUMENTS

| CN | 103563110 A | 2/2014 |
| CN | 104221173 A | 12/2014 |

(Continued)

OTHER PUBLICATIONS

The First Office Action dated Mar. 3, 2020, of counterpart Chinese Application No. 201780005307.2, along with an English translation.

*Primary Examiner* — Kimberly N Rizkallah
*Assistant Examiner* — Dilinh P Nguyen
(74) *Attorney, Agent, or Firm* — DLA Piper LLP (US)

(57) ABSTRACT

An optoelectronic component includes a radiation side, a contact side opposite a radiation side with at least two electrically conductive contact elements for external electrical contacting of the component, and a semiconductor layer sequence arranged between the radiation side and the contact side with an active layer that emits or absorbs electromagnetic radiation during normal operation, wherein the contact elements are spaced apart from each other at the contact side and are completely or partially exposed at the contact side in the unmounted state of the component, the region of the contact side between the contact elements is partially or completely covered with an electrically insulating, contiguously formed cooling element, the cooling element is in direct contact with the contact side and has a (Continued)

US 10,944,033 B2
Page 2 thermal conductivity of at least 30 W/(m·K), and in plan view of the contact side the cooling element covers one or both contact elements partially.

12 Claims, 4 Drawing Sheets

(51) Int. Cl.
| | |
|---|---|
| *H01L 31/024* | (2014.01) |
| *H01L 33/64* | (2010.01) |
| *H01L 31/0224* | (2006.01) |
| *H01L 31/02* | (2006.01) |
| *H01L 33/38* | (2010.01) |
| *H01L 33/54* | (2010.01) |
| *H01L 31/0304* | (2006.01) |
| *H01L 31/0352* | (2006.01) |
| *H01L 33/06* | (2010.01) |
| *H01L 33/30* | (2010.01) |

(52) U.S. Cl.
CPC .... *H01L 31/022408* (2013.01); *H01L 33/641* (2013.01); *H01L 33/642* (2013.01); *H01L 31/0304* (2013.01); *H01L 31/035209* (2013.01); *H01L 33/06* (2013.01); *H01L 33/30* (2013.01); *H01L 33/38* (2013.01); *H01L 33/54* (2013.01); *H01L 2224/16227* (2013.01); *H01L 2224/2929* (2013.01); *H01L 2224/32225* (2013.01); *H01L 2224/83851* (2013.01); *H01L 2933/0075* (2013.01)

(58) Field of Classification Search
USPC .......................................................... 257/99
See application file for complete search history.

(56) References Cited

U.S. PATENT DOCUMENTS

| | | |
|---|---|---|
| 2008/0035947 A1 | 2/2008 | Weaver, Jr. et al. |
| 2008/0212255 A1* | 9/2008 | Miyaji ................ H01L 21/6831 |
| | | 361/234 |
| 2009/0010011 A1 | 1/2009 | Tseng et al. |
| 2009/0026484 A1 | 1/2009 | Hsu et al. |
| 2013/0214295 A1 | 8/2013 | Guevara |
| 2014/0151724 A1 | 6/2014 | Herrmann |
| 2014/0264427 A1 | 9/2014 | Tischler |
| 2015/0041845 A1 | 2/2015 | Schwarz et al. |
| 2015/0108531 A1* | 4/2015 | Schwarz ........... H01L 23/49568 |
| | | 257/99 |
| 2015/0333241 A1 | 11/2015 | Chen et al. |
| 2015/0349232 A1 | 12/2015 | Lee et al. |

FOREIGN PATENT DOCUMENTS

| | | |
|---|---|---|
| DE | 10 2011 101 052 A1 | 11/2012 |
| DE | 10 2012 207 519 A1 | 11/2013 |
| DE | 10 2015 107 864 A1 | 11/2015 |
| EP | 1 816 685 A1 | 8/2007 |
| EP | 2 899 244 A1 | 7/2015 |

* cited by examiner

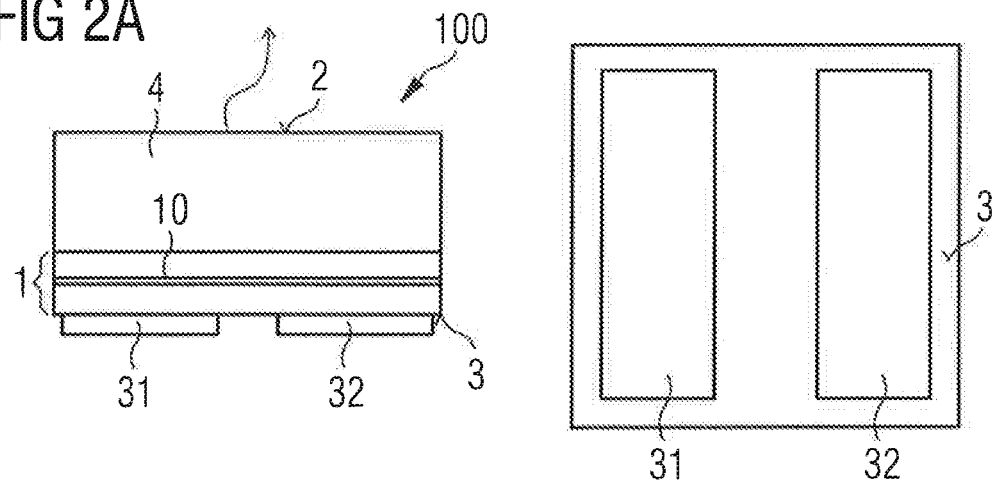
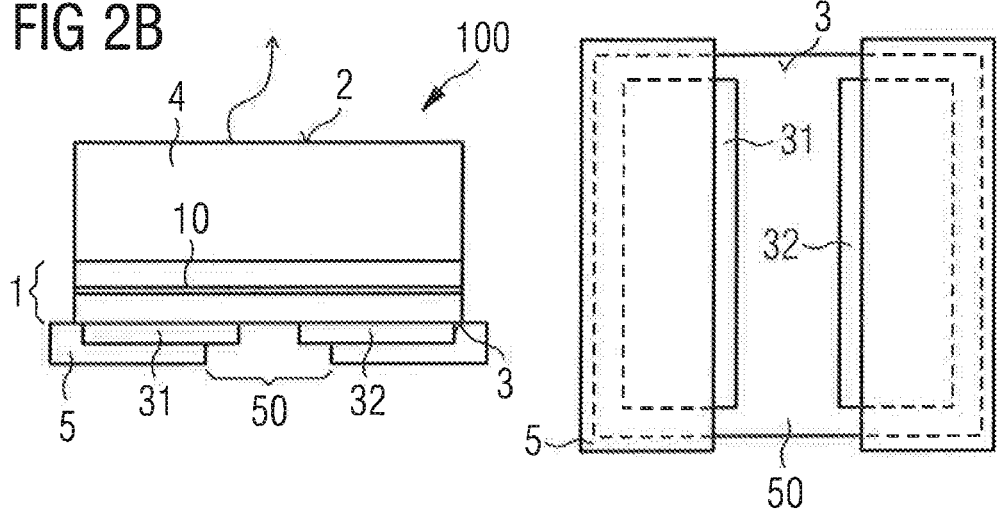
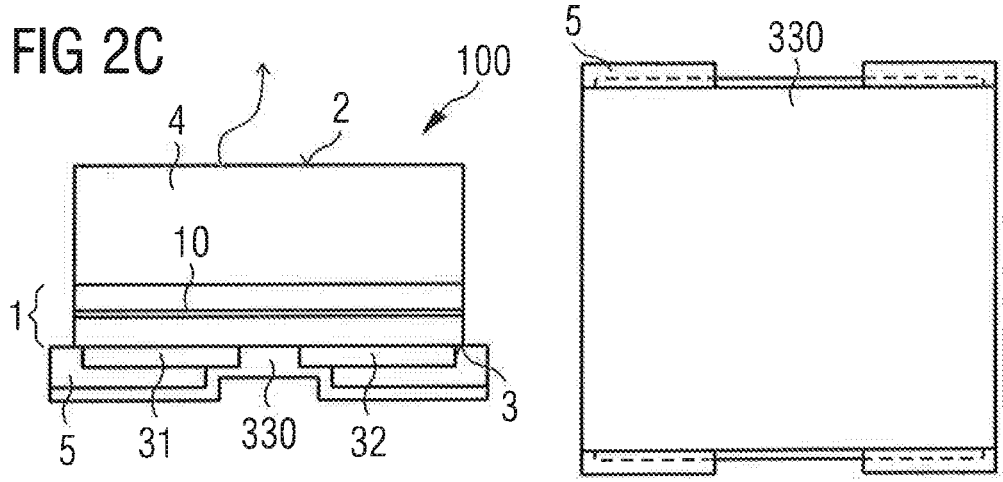

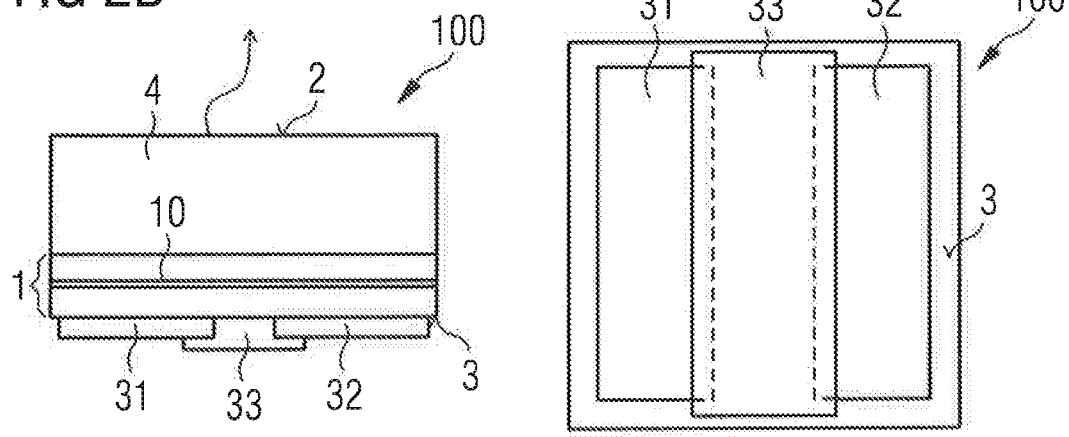
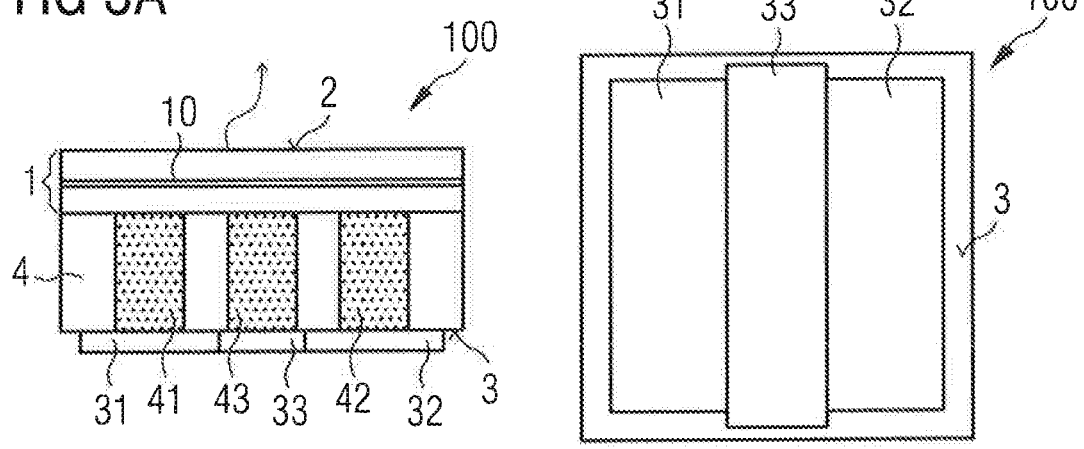
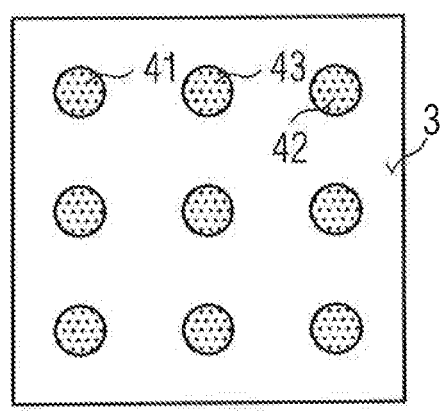

HEAT TRANSMISSIVE OPTOELECTRONIC COMPONENT AND MODULE

TECHNICAL FIELD

This disclosure relates to an optoelectronic component, an optoelectronic module and a method of producing an optoelectronic component.

BACKGROUND

There is a need to provide an optoelectronic component and an optoelectronic module with an effective heat dissipation as well as a method of producing such a component.

SUMMARY

We provide an optoelectronic component including a radiation side via which electromagnetic radiation is coupled in or out during operation, a contact side opposite the radiation side with at least two electrically conductive contact elements for external electrical contacting of the component, and a semiconductor layer sequence arranged between the radiation side and the contact side with an active layer that emits or absorbs the electromagnetic radiation during normal operation, wherein the contact elements are spaced apart from each other at the contact side and are completely or partially exposed at the contact side in the unmounted state of the component, the region of the contact side between the contact elements is partially or completely covered with an electrically insulating, contiguously formed cooling element, the cooling element is in direct contact with the contact side and has a thermal conductivity of at least 30 W/(m·K), and in plan view of the contact side the cooling element covers one or both contact elements partially.

We also provide an optoelectronic module including a connection carrier with at least two electrically conductive connection elements, and the optoelectronic component mounted on the connection carrier with the contact side ahead and fixedly connected to the connection carrier, wherein each of the two contact elements rests on a specially assigned connection element and electrically conductively connects thereto via an electrically conductive connection layer.

We further provide a method of producing an optoelectronic component including:
A) providing a component with a radiation side, a contact side opposite the radiation side and a semiconductor layer sequence between the contact side and the radiation side, wherein the semiconductor layer sequence has an active layer that emits or absorbs electromagnetic radiation during normal operation, the contact side has at least two electrically conductive contact elements for external electrical contacting of the component, the contact elements are spaced apart and are exposed at the contact side;
B) applying a mask having an opening to the contact side, wherein the mask covers the contact elements partially or completely, the region of the contact side between the contact elements is partially or completely exposed in the opening;
C) depositing an electrically insulating material on the mask and within the opening, wherein the electrically insulating material has a thermal conductivity of at least 30 W/(m·K) and is brought in direct contact to the contact side; and
D) removing the mask with the electrically insulating material thereon, wherein the electrically insulating material remaining on the component forms a cooling element between the contact elements, the cooling element is formed contiguously and in top view of the contact side the cooling element covers one or both contact elements partially.

We still further provide an optoelectronic semiconductor chip including a radiation side via which electromagnetic radiation is coupled in or out during operation, a contact side opposite the radiation side with at least two electrically conductive contact elements for external electrical contacting of the semiconductor chip, and a semiconductor layer sequence arranged between the radiation side and the contact side with an active layer that emits or absorbs the electromagnetic radiation during normal operation, wherein the contact elements are spaced apart from each other at the contact side and are completely or partially exposed at the contact side in the unmounted state of the semiconductor chip, the region of the contact side between the contact elements is partially or completely covered with an electrically insulating, contiguously formed cooling element, the cooling element is in direct contact with the contact side and has a thermal conductivity of at least 30 W/(m·K), and in plan view of the contact side the cooling element covers one or both contact elements partially.

BRIEF DESCRIPTION OF THE DRAWINGS

FIGS. 2A to 2D show various positions in an example of a production method in a lateral cross-sectional view and in a plan view of the contact side.

FIGS. 3A and 3B show examples of an optoelectronic component in a lateral cross-sectional view and in a plan view of the contact side.

Figure 1A:
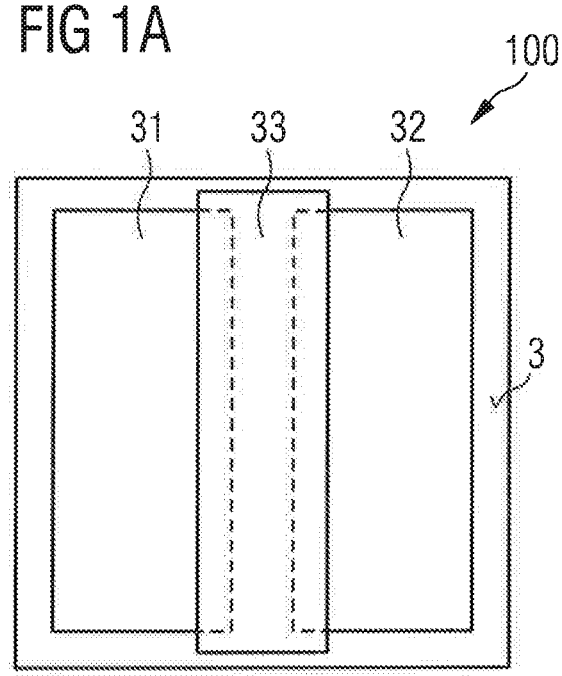
FIGS. 1A and 1B show an example and a modification of an optoelectronic component in plan view of the contact side.

LIST OF REFERENCE NUMBERS 1 semiconductor layer sequence
2 radiation side
3 contact side
4 carrier
10 active layer
31 contact element
32 contact element
33 cooling element
41 contact hole
42 contact hole
43 cooling hole
100 optoelectronic component
200 connection carrier
201 connection element
202 connection element
203 cooling surface
231 electrically conductive connection layer
232 electrically conductive connection layer
233 thermally conductive connection layer
330 electrically insulating material
1000 optoelectronic module

DETAILED DESCRIPTION

Our optoelectronic component may comprise a radiation side, via which electromagnetic radiation such as visible light or UV radiation or infrared radiation is coupled in or coupled out during operation. The radiation side can therefore be designed as a radiation entrance surface or radiation exit surface.

The optoelectronic component is, for example, an optoelectronic semiconductor chip, as it arises directly after singulation from a wafer composite. In an optoelectronic semiconductor chip, the lateral dimensions of the semiconductor chip parallel to the radiation side are, for example, up to ±30% or ±10% or ±5% of the lateral extent of an active layer in the semiconductor chip. In particular, lateral surfaces of such a semiconductor chip extending transversely to the radiation side then have, for example, traces from the singulation process of the wafer composite.

The optoelectronic component may comprise a contact side opposite the radiation side with at least two, preferably exactly two, electrically conductive contact elements. The contact side can be, for example, the entire rear side of the optoelectronic component opposite the radiation side. For example, the radiation side and the contact side form main sides, i.e. those sides of the component with the greatest lateral extent.

The contact elements are, for example, metallic contact elements, in particular soldering elements or soldering pads. For example, the contact elements have a layer structure of different metallic individual layers. It is possible, for example, to have single layers of nickel, gold, platinum, aluminum, silver or tin.

The contact elements cover the contact side, for example, to at least 50% or at least 60% or at least 70% or at least 80%. In particular, the contact elements protrude from the contact side, thereby projecting beyond the contact side in a direction perpendicular to and away from the contact side. The thickness of the contact elements, in particular of the part of the contact elements protruding the contact side, is, for example, at least 500 nm or at least 1 µm or at least 2 µm. Alternatively or additionally, the thickness of the contact elements is at most 5 µm or at most 4 µm or at most 3 µm.

One of the contact elements is preferably a p-contact element, another contact element is preferably an n-contact element. Electrons are injected into the component via the n-contact element, and holes are injected into the component via the p-contact element.

The optoelectronic component may comprise a semiconductor layer sequence with an active layer arranged between the radiation side and the contact side. The active layer preferably emits or absorbs the above-mentioned electromagnetic radiation during normal operation. A large part of the contact side and/or the radiation side can be formed, for example, by the semiconductor layer sequence.

The semiconductor layer sequence is based, for example, on a III-V compound semiconductor material. The semiconductor material is, for example, a nitride compound semiconductor material such as $Al_nIn_{1-n-m}Ga_mN$, or a phosphide compound semiconductor material such as $Al_nIn_{1-n-m}Ga_mP$, or also an arsenide compound semiconductor material such as $Al_nIn_{1-n-m}Ga_mAs$, where $0 \leq n \leq 1$, $0 \leq m \leq 1$ and $m+n \leq 1$, respectively. In this case, the semiconductor layer sequence can have dopants and additional constituents. For the sake of simplicity, however, only the essential constituents of the crystal lattice of the semiconductor layer sequence, i.e. Al, As, Ga, In, N or P, are indicated, even if they can be partially replaced and/or supplemented by small amounts of further substances. The semiconductor layer sequence is preferably based on AlInGaN.

The active layer has, for example, at least one pn-junction and/or one quantum well structure in the form of a single quantum well, SQW for short, or in the form of a multi-quantum well structure, MQW for short.

The contact elements may be spaced apart on the contact side. Preferably, the contact elements are completely or partially exposed on the contact side in the unmounted state of the component. In particular, the contact elements are thus freely accessible in the unmounted state on the contact side and allow the electrical contacting of the component.

The region of the contact side between the contact elements may be partially or completely covered by a, in particular exactly one, electrically insulating cooling element. The cooling element is preferably formed contiguously. For example, in a plan view of the contact side, the contact elements have rectangular basic shapes. Between the two contact elements, an intermediate space or a gap may be formed. In a plan view, the intermediate space or gap may be partially or completely covered or filled by the cooling element. In particular, the cooling element can form-fit the regions of the contact side and the contact elements bordering at the intermediate space.

The cooling element may be, for example, an electrically insulating layer. In particular, the thickness of the cooling element, measured transversely or perpendicular to the contact side, is, for example, at least 100 nm or at least 200 nm or at least 500 nm. Alternatively or additionally, the thickness of the cooling element is at most 5 µm or at most 2 µm or at most 1.5 µm or at most 1 µm.

The cooling element may be in direct mechanical contact with the contact side. In particular, the cooling element may be in direct mechanical contact with the contact side and possibly with the contact elements in the intermediate space. The thermal conductivity of the cooling element is preferably at least 30 W/(m·K) or at least 60 W/(m·K) or at least 100 W/(m·K) or at least 150 W/(m·K).

The optoelectronic component may comprise a radiation side, via which electromagnetic radiation is coupled in or out during operation. The radiation side is opposite a contact side with at least two electrically conductive contact elements for external electrical contacting of the component. Furthermore, the optoelectronic component comprises a semiconductor layer sequence arranged between the radiation side and the contact side with an active layer which emits or absorbs the electromagnetic radiation during normal operation. The contact elements are spaced apart on the contact side and are completely or partially exposed on the contact side in the unmounted state of the component. The region of the contact side between the contact elements is partially or completely covered with an electrically insulating cooling element. The cooling element is in direct contact with the contact side and has a thermal conductivity of at least 30 W/(m·K).

The components, modules and methods described herein are based inter alia on the idea that contact elements or solder pads on the rear side of components are often subject to certain design conditions. In particular, the distance between the contact elements should preferably not be selected too small to avoid overflowing of the solder material, so-called bridging, and associated short circuits between the contact elements during soldering of the component on a connection carrier. In conventional soldering, the distance between the contact elements is, for example, 150 µm to 250 µm.

Due to the increasing demand for ever smaller components or semiconductor chips, for example, with dimensions in the lateral direction of at most 500 µm×500 µm, the contact elements are accordingly also selected smaller at the rear side. This complicates the effective cooling of the component. As a result, both the efficiency of the components and the maximum allowable currents are lower.

Nevertheless, to achieve effective cooling, the distance between the contact elements can be chosen to be lower, for example, to values of at most 150 µm. However, in this case, often more elaborate soldering such as eutectic soldering is used, which is often carried out at significantly higher temperatures, which in turn increases the cost of production. This requires restrictions on the possible usable connection carrier to which the components can be soldered, as they may not be able to withstand the high temperatures.

Among other things, we improve heat dissipation of the component by increasing the area at the rear side over which effective cooling takes place. This happens, for example, in that an insulating cooling element is attached between the contact elements. The contact elements together with the cooling element can then cover, for example, almost the entire rear side or contact side of the component. The required gap or intermediate space between the contact elements is also used in this way for the dissipation of heat. In addition, overflow of the solder material can be prevented by the cooling element due to a wettability with solder material which is reduced compared to the contact elements, which allows smaller distances between the contact elements, for example, at most 50 µm.

The component may have a carrier that stabilizes the component. The carrier can be arranged between the semiconductor layer sequence and the contact side, wherein the contact side is then formed, for example, by the carrier or is part of the carrier. The carrier preferably comprises or consists of an electrically insulating material. The component can be self-supporting due to the carrier.

The carrier is in particular a plastic carrier or silicone carrier or silicon carrier or SiC carrier or germanium carrier or glass carrier. Also, the carrier may comprise or consist of silicon oxide such as $SiO_2$ or an epoxide. The material of the carrier differs in particular from the material of the cooling element.

Preferably, the carrier is a potting, also called mold, preferably a plastic potting or silicone potting or $SiO_2$ potting, which is molded on the semiconductor layer sequence in the wafer composite and is then cured. The component is preferably free of a growth substrate for the semiconductor layer sequence.

The component is, for example, a self-supporting, potted semiconductor chip, so-called Mold Supported Chip, MSC for short. In such a component, the growth substrate for the semiconductor layer sequence is removed and the stabilizing carrier is formed by a potting.

The thickness of the carrier, measured perpendicular to the contact side is, for example, at least 100 µm or at least 120 µm or at least 150 µm. Alternatively or additionally, the thickness of the carrier is at most 200 µm or at most 180 µm or at most 170 µm. In particular, the component is not mechanically self-supporting without the carrier. Thus, for example, the component does not comprise any further carrier in addition to the carrier, in particular no further mechanically self-supporting carrier.

The component may comprise at least one cooling hole and at least two contact holes, wherein the cooling hole and the contact holes extend from the contact side through the entire carrier and extend to the semiconductor layer sequence. The contact holes and the cooling hole can be, for example, cylindrical or cuboid recesses in the carrier, wherein the bottom surfaces of the cylinders or cuboids are formed in the region of the contact side and the semiconductor layer sequence.

The contact holes, preferably also the cooling hole, may be filled with an electrically conductive material, for example, a metal, in particular completely filled up. The metal may, for example, comprise or consist of nickel and/or copper. The semiconductor layer sequence can electrically conductively connect to the contact elements via the electrically conductive material in the contact holes.

A thermally conductive filling in the cooling hole, for example, the abovementioned metal, may be in direct contact with the semiconductor layer sequence and/or with the cooling element at the contact side. Preferably, in normal operation, the thermally conductive filling is not used to electrically contact the component, but for thermal coupling of the cooling element to the semiconductor layer sequence. Thus, no charge carriers are preferably exchanged between the contact side and the semiconductor layer sequence via the cooling hole or the filling. The thermal conductivity of the filling is, for example, at least 30 W/(m·K).

The carrier may have a thermal conductivity of at most 10 W/(m·K) or at most 5 W/(m·K) or at most 1 W/(m·K).

The component may comprise a plurality of cooling holes. For example, a cooling hole is arranged in each case between two contact holes. For example, each cooling hole is arranged between a contact hole assigned to the n-contact element and a proximal contact hole assigned to the p-contact element.

A carrier stabilizing the component such as a sapphire carrier may be arranged between the radiation side and the semiconductor layer sequence. The carrier then also serves, for example, as a growth substrate for the semiconductor layer sequence. Another carrier stabilizing the component or another self-supporting carrier additional to the growth substrate is then preferably not used. In particular, the component may be a so-called flip-chip.

Alternatively, the component is, for example, free of a carrier and not mechanically self-supporting. Only by soldering or mounting on a connection carrier, the component is mechanically stabilized.

At least 70% or at least 80% or at least 90% of the contact side may be covered by the cooling element and the contact elements in plan view of the contact side. That is, for example, at least 70% of the contact side can be used to dissipate heat generated in the component during operation.

The distance, for example, the minimum distance or the average distance, between the contact elements on the contact side may be at most 50 µm or at most 30 µm or at most 10 µm or at most 5 µm.

In a plan view of the contact side, the cooling element may partially cover one or both contact elements. That is, the cooling element is guided from the intermediate space between the two contact elements to the side facing away from the radiation side of the contact element or the contact elements. In particular, the cooling element can reshape the edges of the contact elements adjacent to the intermediate space in a conforming or form-fitting manner. Preferably, in this way, the minimum distance between regions of the two contact elements not covered by the cooling element is greater than the minimum distance of the contact elements. Particularly preferably, seen in plan view of the contact side, the contact elements are then not covered by any other element or any other material than the cooling element in the unmounted state.

The minimum distance between regions of the two contact elements not covered by the cooling element may be at least 150 µm or at least 170 µm or at least 200 µm. In this case, although the contact elements are brought close to each other, the freely accessible region of the contact elements used, for example, for a solder joint meet the minimum spacing requirements described above. In other words, the shortest connection between a region of the one contact element not covered by the cooling element and a region of the other contact element not covered by the cooling element is at least 150 µm.

The cooling element may be in direct mechanical contact with one or both contact elements.

The cooling element may terminate flush with the contact elements in the direction away from the component. The cooling element then has, for example, a thickness measured perpendicular to the contact side, which corresponds essentially to the thickness of the contact elements. For example, "essentially" means that deviations of at most 20% or 10% occur.

The cooling element may comprise or consist of an oxide or a non-oxide ceramic or an epoxide or a solder stop paste.

The cooling element may comprise or consist of one or more of the following materials: aluminum nitride such as AlN, silicon carbide such as SiC, especially SSiC, αSiC, SSiC with graphite or SiSiC, silicon nitride such as SiN, alumina such as $Al_2O_3$.

In addition, an optoelectronic module is specified. The optoelectronic module has, for example, an optoelectronic component described herein. All the features disclosed for the optoelectronic component are thus also disclosed for the optoelectronic module and vice versa.

The optoelectronic module may comprise a connection carrier. The connection carrier is, for example, a printed circuit board, PCB for short, or a metal core board, MCB for short, or a silicon carrier with integrated microelectronics or a ceramic carrier with, for example, electrical connections.

The connection carrier preferably has at least two electrically conductive, for example, metallic, connection elements. The connection elements are, for example, exposed before assembly of the component and can form soldering areas or soldering pads on the connection carrier.

The optoelectronic component is preferably mounted with the contact side ahead on the connection carrier and firmly connected to the connection carrier. In particular, each of the two contact elements is placed on a specifically uniquely associated connection element and electrically connected thereto in each case via an electrically conductive connection layer. The electrically conductive connection layers may be, for example, a solder paste or an electrically conductive adhesive. The electrically conductive connection layers are, for example, in direct mechanical contact both with the associated contact elements and with the associated connection elements. Also, the contact elements of the optoelectronic component can be in direct electrical and mechanical contact with the connection elements of the connection carrier.

Current is preferably injected into the optoelectronic component via the connection carrier in the intended operation.

The electrically conductive connection layers of the contact elements may be separated from one another and spaced and thus insulated from one another. A short circuit between the contact elements or connection layers is thus prevented.

A thermally conductive connection layer may be arranged between the electrically conductive connection layers. The thermally conductive connection layer is preferably electrically insulating. For example, it is a thermal paste, for example, based on silicone or zinc oxide, with a preferred thermal conductivity of at least 10 W/(m·K) or 30 W/(m·K) or 50 W/(m·K) or 100 W/(m·K).

The thermally conductive connection layer may be in direct contact with the cooling element and the connection carrier. In this way, heat generated during operation can be dissipated via the cooling element and the thermally conductive connection layer from the component to the connection carrier.

The electrically conductive connection layers of the two contact elements may connect and form a common electrically conductive connection layer. In this case, the common electrically conductive connection layer has preferably an electrically insulating effect in the lateral direction, parallel to the contact side. For example, it is a so-called anisotropically conductive paste, ACP for short. Such pastes include, for example, an insulating matrix material and embedded therein metallic beads. In the lateral direction, the beads are spaced apart by the matrix material so that no current flow takes place in the lateral direction. In the vertical direction, perpendicular to the contact side, however, the component and the connection carrier are pressed against each other so strongly that the thickness of the electrically conductive connection layer is reduced to the diameter of the metallic beads and thus a flow of current in the vertical direction can occur over the metallic beads.

The common electrically conductive connection layer may cover the cooling element in a plan view of the contact side and may be in direct contact with the cooling element and preferably also with the connection carrier.

In addition, we provide a method of producing an optoelectronic component. The method is particularly suitable for the production of a component described herein. All features disclosed in connection with the optoelectronic component are therefore also disclosed for the method and vice versa.

The method may comprise a step A), in which a component having a radiation side, a contact side opposite the radiation side, and a semiconductor layer sequence between the contact side and the radiation side is provided. The semiconductor layer sequence has an active layer that emits or absorbs electromagnetic radiation during normal operation. The contact side further comprises at least two electrically conductive contact elements for external electrical contacting of the component. The contact elements on the contact side are spaced apart and exposed.

In a step B), a mask having an opening is applied to the contact side. The mask covers the contact elements partially or completely. In the opening of the mask, the region of the contact side between the contact elements is partially or completely exposed.

In a step C), an electrically insulating material is deposited on the mask and within the opening, wherein the electrically insulating material has a thermal conductivity of at least 30 W/(m·K) and is brought in direct mechanical contact with the contact side in the region between the contact elements.

In a further step D), the mask with the electrically insulating material located thereon is removed, wherein the electrically insulating material remaining on the component forms a cooling element for the optoelectronic component between the contact elements.

The steps A) to D) are preferably carried out individually and successively in the specified order.

The mask with the opening may be manufactured by a lithography process. The mask is then formed, for example, from a photoresist.

The electrically insulating material may be deposited via atomic layer deposition, ALD for short, or via chemical vapor deposition, CVD for short, or via sputtering.

Hereinafter, a method of producing an optoelectronic component as well as an optoelectronic component described herein are described with reference to the drawings by examples. Like reference numerals indicate like elements in the figures. However, the size ratios involved are not to scale, individual elements may rather be illustrated with an exaggerated size for a better understanding.

FIG. 1A shows an example of an optoelectronic component 100 in a plan view of a contact side 3. Two rectangular contact elements 31, 32 arranged on the contact side 3 can be seen. The contact elements 31, 32 have, for example, different polarities. For example, the left contact element 31 is an n-contact element, the right contact element 32 is a p-contact element. The contact elements 31, 32 are used in normal operation for external electrical contacting of the component 100.

The contact elements are, for example, solder contacts or solder pads protruding from the contact side 3 out of the drawing plane and have a layer structure of Ni/Au, Ni/Pt/Au or Au/Sn or consist thereof.

Between the two contact elements 31, 32, an intermediate space or gap is formed that spaces the two contact elements 31, 32 from each other. In this region, an electrically insulating cooling element 33 is arranged, which completely covers or fills the intermediate space or gap. In addition, the cooling element 33 partially covers the regions of the two contact elements 31, 32 that adjoin the gap in a plan view of the contact side 3. Also, the cooling element 33 is rectangular in plan view and in particular formed contiguously.

The distance between the two contact elements 31, 32 is, for example, at most 50 µm in FIG. 1A, whereas the width of the cooling element 33 is at least 150 µm, for example. In this way, the distance between the regions of the contact elements 31, 32 not covered by the cooling element 33, is also at least 150 µm. This can prevent that when contacting the component 100, for example, via a solder connection, it comes to an overflow of the solder material and thus to short circuits.

The cooling element 33 is formed of, for example, an oxide ceramic such as $Al_2O_3$, or a non-oxide ceramic such as AlN or SiC. The thermal conductivity of the cooling element 33 is preferably at least 30 W/(m·K).

In FIG. 1A at least 90% of the contact side 3 is covered by the cooling element 33 and the contact elements 31, 32, for example. In this way, an effective heat dissipation from the component 100 via the contact side 3 can take place.

Figure 1B:
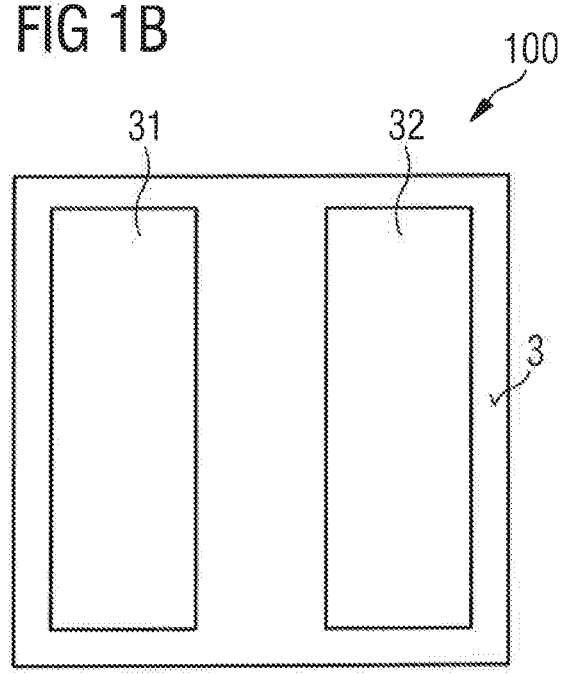

FIG. 1B shows a modification of an optoelectronic component 100 in plan view of the contact side 3. In contrast to FIG. 1A, the electrically insulating cooling element 33 is missing, which is preferably not or poorly wettable by the solder material. This has two consequences. On the one hand, the distance between the two contact elements 31, 32 is chosen to be larger to prevent overflow of the solder material during connection. On the other hand, due to the missing cooling element 33, the proportion of the contact side 3 via which heat can be removed, is restricted predominantly to the regions of the contact elements 31, 32. The effective surface of the contact side 3 suitable for heat dissipation is thus reduced compared to the example of FIG. 1A.

FIG. 2A shows a first position in a method of producing an optoelectronic component 100. The left-hand image of FIG. 2A shows a component with a semiconductor layer sequence 1 and a carrier 4 in a lateral cross-sectional view. The semiconductor layer sequence 1 is based, for example, on GaN. The carrier 4 is, for example, a growth substrate for the semiconductor layer sequence 1, for example, a sapphire substrate. The semiconductor layer sequence 1 comprises an active layer 10 via which electromagnetic radiation is emitted or absorbed during normal operation. A side of the carrier 4 facing away from the semiconductor layer sequence 1 forms a radiation side 2 via which the electromagnetic radiation (shown by a curved arrow in FIGS. 2A-2D, 3A, 4A and 4B) is coupled out of the component or coupled into the component. A side of the semiconductor layer sequence 1 facing away from the carrier 4 forms the contact side 3 with the two contact elements 31, 32. The component shown in FIG. 2A is, for example, a so-called flip chip.

The right-hand image of FIG. 2A shows the component in a plan view of the contact side 3.

FIG. 2B shows a position in the method in which a mask 5 is applied to the contact side 3. The mask 5 consists, for example, of a photoresist. Furthermore, the mask 5 has an opening 50. The opening 50 can be introduced into the mask 5 via a lithography process.

In the region of the opening 50, the intermediate space between the two contact elements 31, 32 is completely exposed. In addition, a portion of the two contact elements 31, 32 is exposed in the region of the opening 50 in each case. The remainder of the contact side 3, in particular the remainder of the contact elements 31, 32, is completely covered by the mask 5, as can be seen also in the plan view in the right-hand image of FIG. 2B.

FIG. 2C shows a position in the method in which an electrically insulating material 330 in the form of a layer is deposited on the contact side 3 and on the mask 5. The deposition takes place, for example, by ALD or CVD or sputtering. The electrically insulating material is, for example, AlN or SiC. When applied, the electrically insulating material 330 is brought into direct mechanical contact with the contact elements 31, 32 and the contact side 3 in the region of the opening 50 of the mask 5. In particular, the electrically insulating material 330 completely fills the gap between the two contact elements 31, 32 and covers the exposed region of the contact elements 31, 32, respectively.

The layer thickness of the electrically insulating material 330 on the contact elements 31, 32 is, for example, 100 nm to 5 µm.

In FIG. 2D, a position in the method is shown after the mask 5 is detached from the contact side 3. In this case, those components of the electrically insulating material 330 deposited on the mask 5 are removed together with the mask 5. What remains is an electrically insulating cooling element 33 that fills the gap between the two contact elements 31, 32 and covers parts of the contact elements 31, 32.

FIG. 3A shows a further example of an optoelectronic component 100 in cross-sectional view and top view of the contact side 3. It can be seen that, unlike in the previous examples, the semiconductor layer sequence 1 is arranged between the carrier 4 and the radiation side 2. The carrier 4 is in this case not the growth substrate but, for example, a plastic carrier. The growth substrate for the semiconductor layer sequence 1 is already removed. The component 100 of FIG. 3A is in particular a self-supporting, encapsulated semiconductor chip, a so-called Mold Supported Chip, MSC for short. In this case, the carrier 4 is, for example, a plastic potting.

The carrier 4 has contact holes 41, 42 and cooling holes 43. The contact holes 41, 42 and the cooling holes 43 extend from the contact side 3 up to the semiconductor layer sequence 1.

The contact holes 41, 42 and the cooling holes 43 are filled, for example, with a metal such as nickel or copper. On the contact side 3, the metal of the contact holes 41, 42 and the cooling holes 43 is in direct contact with the contact elements 31, 32 and the cooling element 33. Via the contact holes 41, 42 there is an energization of the semiconductor layer sequence 1 during operation. By contrast, the cooling holes 43 are not used to exchange charge carriers between the contact side 3 and the semiconductor layer sequence 1.

Via the contact holes 41, 42 and the cooling holes 43, heat, which is generated by the semiconductor layer sequence 1 during operation, is transported in the direction of the contact side 3.

FIG. 3B shows a plan view of the contact side 3, wherein the contact elements 31, 32 and the cooling element 33 are removed. It can be seen that the contact holes 41, 42 and the cooling holes 43 are arranged like a matrix. A column with a plurality of cooling holes 43 is arranged between two columns, each having a plurality of contact holes 41, 42. In FIG. 3A, the column of the plurality of cooling holes 43 is covered by a single cooling element 33, the two columns with the contact holes 41, 42 are each covered by a single contact element 31, 32.

Figure 4A:
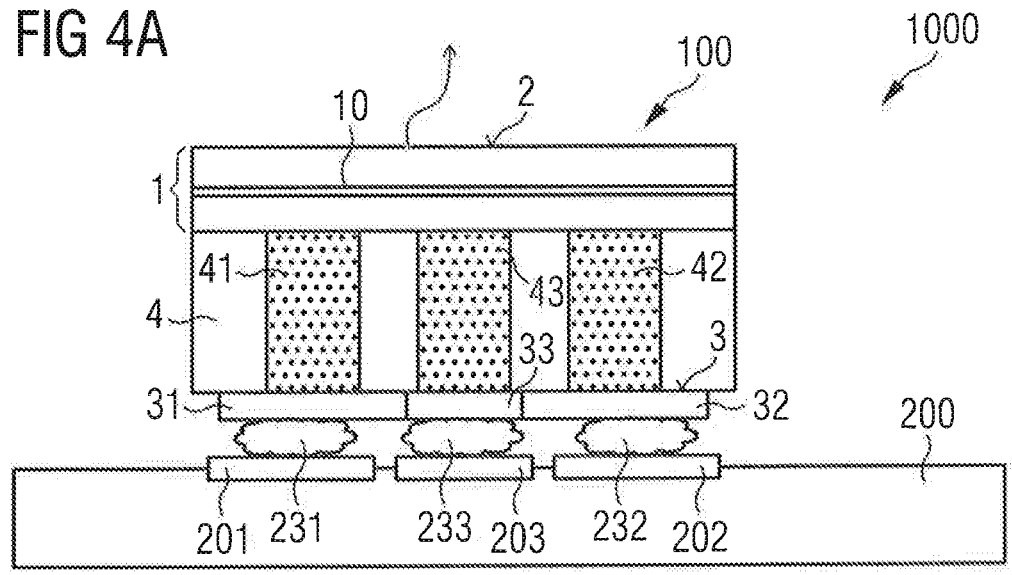
FIGS. 4A and 4B show examples of an optoelectronic module in a lateral cross-sectional view.
Figure 4B:
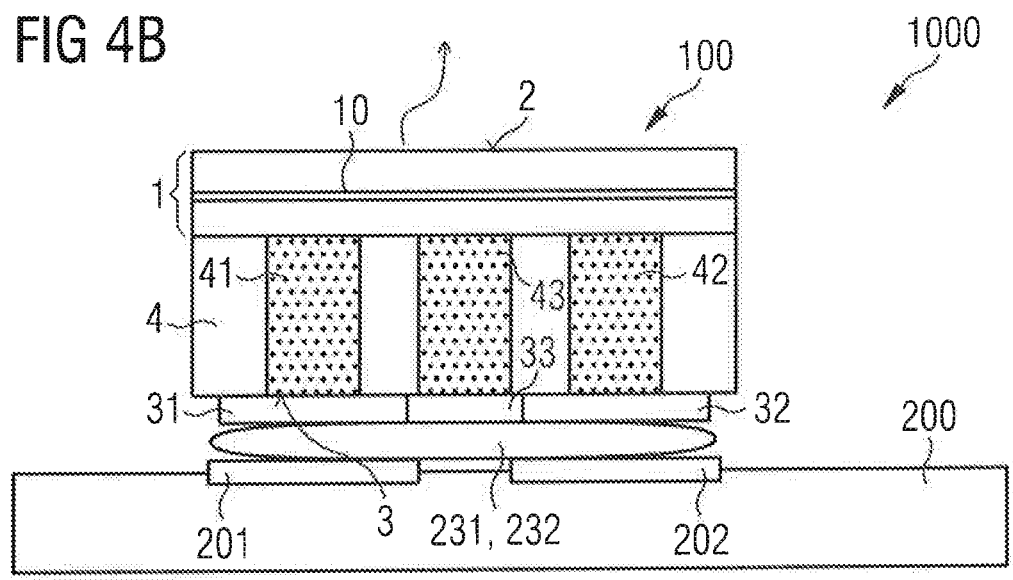

In the examples of FIGS. 4A and 4B, an optoelectronic module 1000 is shown in lateral cross-sectional view, in each case. The optoelectronic module 1000 comprises an optoelectronic component 100 according to the example of FIGS. 3A, 3B. Furthermore, the optoelectronic module 1000 comprises a connection carrier 200 with at least two connection elements 201, 202. The optoelectronic component 100 is fastened with the contact side 3 ahead on the connection carrier 200. In this case, the contact elements 31, 32 each connect via electrically conductive connection layers 231, 232 to the preferably metallic connection elements 201, 202. The electrically conductive connection layers 231, 232 are, for example, a solder paste or an electrically conductive adhesive.

The connection carrier 200 is, for example, a silicon carrier with microelectronics, via which the component 100 is electrically contacted in the intended operation.

In addition, it can be seen in FIG. 4A that the cooling element 33 connects to the connection carrier 200 via a thermally conductive connection layer 233. The thermally conductive compound layer 233 is in direct contact with the cooling element 33 as well as with, for example, a metallic, cooling surface 203 of the connection carrier 200. In this way, heat can be transported away from the component 100 to the connection carrier 200 via the cooling element 33 and the thermally conductive connection layer 233. The thermally conductive connecting layer 233 is, for example, a thermal paste.

In FIG. 4B, in contrast to FIG. 4A, a single contiguous connection layer 231, 232 is formed between the component 100 and the connection carrier 200. The common connection layer 231, 232 is in direct contact with the first contact element 31 and the second contact element 32 and the cooling element 33. For example, the common connection layer 231, 232 is formed of an anisotropic conductive paste, ACP. In this way, a short circuit between the contact elements 31, 32 is prevented, but nevertheless a power supply via the connection carrier 200 to the component 100 is granted. In addition, the heat emitted by the contact elements 31, 32 and the cooling element 33 is transferred to the connection carrier 200 via the common connection layer 231, 232.

This application claims priority of DE 102016100320.4, the subject matter of which is incorporated herein by reference.

The components, modules and methods described herein are not limited by the description in conjunction with the examples. Rather, the components, modules and methods comprise any new feature as well as any combination of features, particularly including any combination of features in the appended claims, even if the feature or combination per se is not explicitly stated in the claims or examples.

The invention claimed is:

1. An optoelectronic component comprising:
a radiation side via which electromagnetic radiation is coupled in or out during operation,
a contact side opposite the radiation side with at least two electrically conductive contact elements for external electrical contacting of the optoelectronic component,
a semiconductor layer sequence arranged between the radiation side and the contact side with an active layer that emits or absorbs the electromagnetic radiation during normal operation,
a carrier between the semiconductor layer sequence and the contact side, said carrier mechanically stabilizing the component, wherein the contact side is formed by the carrier,
at least one cooling hole and at least two contact holes, wherein the cooling hole and the contact holes extend from the contact side through the entire carrier and extend to the semiconductor layer sequence, wherein
the at least two electrically conductive contact elements, are spaced apart from each other at the contact side and are completely or partially exposed at the contact side in the unmounted state of the optoelectronic component,
a region of the contact side between the at least two electrically conductive contact elements is partially or completely covered with an electrically insulating, contiguously formed cooling element,
the cooling element is in direct contact with the contact side and has a thermal conductivity of at least 30 W/(m·K),
in plan view of the contact side the cooling element covers one or both of the at least two electrically conductive contact elements partially,
the contact holes and the cooling hole are filled with a metal,
the semiconductor layer sequence electrically connects to the at least two electrically conductive contact elements via the metal in the contact holes,
the metal in the cooling hole is in direct contact with the cooling element at the contact side and does not serve for electrical contacting of the component during normal operation, and
the carrier has a thermal conductivity of at most 10 W/(m·K).

2. The optoelectronic component according to claim 1, wherein
a carrier stabilizing the component is arranged between the radiation side and the semiconductor layer sequence, or
the component is free of a carrier and not self-supporting mechanically.

3. The optoelectronic component according to claim 1, wherein
the thermal conductivity of the cooling element is at least 100 W/(m·K), and
in plan view of the contact side at least 70% of the contact side is covered by the cooling element and the contact elements.

4. The optoelectronic component according to claim 1, wherein
a distance between the at least two electrically conductive contact elements at the contact side is at most 50 μm, and
a minimum distance between regions of the two contact elements not covered by the cooling element is at least 150 μm.

5. The optoelectronic component according to claim 1, wherein the cooling element is in direct contact with one or both of the at least two electrically conductive contact elements.

6. The optoelectronic component according to claim 1, wherein the thickness of the cooling element, measured in the direction perpendicular to the contact side, is 100 nm to 5 μm.

7. The optoelectronic component according to claim 1, wherein the cooling element comprises or consists of an oxide ceramic or a non-oxide ceramic or an epoxy or a solder stop paste.

8. The optoelectronic component according to claim 7, wherein the cooling element comprises or consists of one or more of the following materials: aluminum nitride, silicon carbide, aluminum oxide and silicon nitride.

9. An optoelectronic module comprising:
a connection carrier with at least two electrically conductive connection elements, and
an optoelectronic component mounted on the connection carrier with the contact side ahead and fixedly connected to the connection carrier, wherein
each of the at least two electrically conductive contact elements rests on a specially assigned connection element and electrically conductively connects thereto via an electrically conductive connection layer, wherein the optoelectronic component comprises:
a radiation side via which electromagnetic radiation is coupled in or out during operation,
a contact side opposite the radiation side with at least two electrically conductive contact elements for external electrical contacting of the optoelectronic component, and
a semiconductor layer sequence arranged between the radiation side and the contact side with an active layer that emits or absorbs the electromagnetic radiation during normal operation, wherein
the at least two electrically conductive contact elements are spaced apart from each other at the contact side and are completely or partially exposed at the contact side in the unmounted state of the optoelectronic component,
a region of the contact side between the at least two electrically conductive contact elements is partially or completely covered with an electrically insulating, contiguously formed cooling element,
the cooling element is in direct contact with the contact side and has a thermal conductivity of at least 30 W/(m·K), and
in plan view of the contact side the cooling element covers one or both of the at least two electrically conductive contact elements partially.

10. The optoelectronic module according to claim 9, wherein
the electrically conductive connection layers of the contact elements are separated and spaced apart,
a thermally conductive connection layer is located between the electrically conductive connection layers, and
the thermally conductive connection layer is in direct contact with the cooling element and the connection carrier.

11. The optoelectronic module according to claim 9, wherein
the electrically conductive connection layers of the at least two electrically conductive contact elements are connected and form a common electrically conductive connection layer,
the common electrically conductive connection layer acts as insulation in a lateral direction, parallel to the contact side, and
in plan view of the contact side the common electrically conductive connection layer covers the cooling element and is in direct contact thereto.

12. An optoelectronic module comprising:
a connection carrier with at least two electrically conductive connection elements, and an optoelectronic semiconductor chip comprising:
a radiation side via which electromagnetic radiation is coupled in or out during operation,
a contact side opposite the radiation side with at least two electrically conductive contact elements for external electrical contacting of the optoelectronic semiconductor chip, and
a semiconductor layer sequence arranged between the radiation side and the contact side with an active layer that emits or absorbs the electromagnetic radiation during normal operation, wherein
the at least two electronically conductive contact elements are spaced apart from each other at the contact side and are completely or partially exposed at the contact side in the unmounted state of the optoelectronic semiconductor chip,
a region of the contact side between the at least two electrically conductive contact elements is partially or completely covered with an electrically insulating, contiguously formed cooling element,
the cooling element is in direct contact with the contact side and has a thermal conductivity of at least 30 W/(m·K),
wherein
the optoelectronic semiconductor chip is mounted with the contact side ahead and fixedly connected to the connection carrier, and
each of the at least two electrically conductive contact elements rests on a specially assigned connection element and electrically conductively connects thereto via an electrically conductive connection layer.

* * * * *